United States Patent
Kitano et al.

(10) Patent No.: US 9,110,106 B2
(45) Date of Patent: Aug. 18, 2015

(54) PHASE DIFFERENCE DETECTOR, PHASE DIFFERENCE DETECTION PROGRAM, AND PLASMA PROCESSING SYSTEM USING THE PHASE DIFFERENCE DETECTOR

(71) Applicant: DAIHEN Corporation, Osaka-shi, Osaka (JP)

(72) Inventors: Toyokazu Kitano, Osaka (JP); Yoshinobu Kasai, Osaka (JP); Yuji Yoshizako, Osaka (JP)

(73) Assignee: DAIHEN Corporation, Osaka (JP)

( * ) Notice: Subject to any disclaimer, the term of this patent is extended or adjusted under 35 U.S.C. 154(b) by 234 days.

(21) Appl. No.: 13/904,514

(22) Filed: May 29, 2013

(65) Prior Publication Data
US 2013/0320852 A1 Dec. 5, 2013

(30) Foreign Application Priority Data

Jun. 4, 2012 (JP) ................. 2012-127048

(51) Int. Cl.
| | |
|---|---|
| *H01J 7/24* | (2006.01) |
| *H05B 31/26* | (2006.01) |
| *G01R 25/00* | (2006.01) |
| *H05H 1/46* | (2006.01) |
| *H01J 37/32* | (2006.01) |

(52) U.S. Cl.
CPC ............ *G01R 25/00* (2013.01); *H01J 37/32917* (2013.01); *H01J 37/32926* (2013.01); *H01J 37/32935* (2013.01); *H05H 1/46* (2013.01); *H05H 2001/4682* (2013.01)

(58) Field of Classification Search
CPC ........ G01R 25/00; G01R 25/04; G01R 13/04; G01R 29/26; G01R 31/42; H05H 1/46; H01J 37/32082; H01J 37/32192

USPC ............. 315/111.21, 111.31, 111.41, 111.51, 315/111.61, 111.71, 111.01; 702/64, 72, 702/106; 708/800, 819; 313/231.01, 313/231.31, 231.41, 231.51, 231.61; 324/76.77, 76.78, 76.55, 607; 370/350; 375/140, 14, 200, 206, 376, 371; 364/717; 327/164, 105, 119

See application file for complete search history.

(56) References Cited

U.S. PATENT DOCUMENTS

| | | | | |
|---|---|---|---|---|
| 3,875,394 | A | * | 4/1975 | Shapely et al. ................. 702/72 |
| 5,663,992 | A | * | 9/1997 | Farmer ........................... 375/376 |

(Continued)

FOREIGN PATENT DOCUMENTS

JP  3808973  5/2006

*Primary Examiner* — Lincoln Donovan
*Assistant Examiner* — Thomas Skibinski
(74) *Attorney, Agent, or Firm* — Hamre, Schumann, Mueller & Larson, P.C.

(57) ABSTRACT

A phase difference detector detects the phase difference between two AC signals at a high speed and with high accuracy. A phase difference computation unit computes the phase difference $\phi_r(=\phi_2-\phi_1)$ between two detected voltages $v_1$ (phase angle: $\phi_1$) and $v_2$ (phase angle: $\phi_2$). The phase difference computation unit uses a sine wave $v_s$ and a cosine wave $v_c$ generated separately and having the same frequency as the fundamental frequency of the voltages $v_1$ and $v_2$, to perform computation of $v_{2s}=v_2 \times v_s$, $v_{2c}=v_2 \times v_c$, $v_{1s}=v_1 \times v_s$, $v_{1c}=v_1 \times v_c$, and then extracts DC components $I_2=(-A_2/2) \cdot \sin(\phi_2)$, $R_2=(A_2/2) \cdot \cos(\phi_2)$, $I_1=(-A_1/2) \cdot \sin(\phi_1)$, $R_1=(A_1/2) \cdot \cos(\phi_1)$ at low-pass filters. The phase difference computation unit computes $R_3=R_1 \times R_2+I_1 \times I_2$ at a complex multiplying unit to obtain $R_3=(A_1 \cdot A_2/4) \cdot \cos(\phi_r)$, computes $I_3=R_2 \times I_1-R_1 \times I_2$ to obtain $I_3=(A_1 \cdot A_2/4) \cdot \sin(\phi_r)$, and computes $\phi_r=\tan^{-1}(I_3/R_3)$ at the arctangent calculation unit, thereby obtaining the phase difference $\phi_r$.

10 Claims, 3 Drawing Sheets

(56) References Cited

U.S. PATENT DOCUMENTS

| | | | |
|---|---|---|---|
| 5,953,370 A * | 9/1999 | Durrant et al. | 375/150 |
| 6,282,228 B1 * | 8/2001 | Monroe | 375/140 |
| 7,227,346 B1 * | 6/2007 | Solbrig | 324/76.78 |
| 2002/0031617 A1 * | 3/2002 | Sumiya et al. | 427/569 |
| 2003/0056157 A1 * | 3/2003 | Fala et al. | 714/700 |
| 2006/0248138 A1 * | 11/2006 | Tanaka et al. | 708/800 |
| 2008/0224689 A1 * | 9/2008 | Halverson et al. | 324/76.78 |

* cited by examiner

PHASE DIFFERENCE DETECTOR, PHASE DIFFERENCE DETECTION PROGRAM, AND PLASMA PROCESSING SYSTEM USING THE PHASE DIFFERENCE DETECTOR

BACKGROUND OF THE INVENTION

1. Field of the Invention

The present invention relates to a phase difference detector for computing the phase difference between two alternating current signals (AC signals) having the same frequency. The invention also relates to a program for detecting such a phase difference, and to a plasma processing apparatus utilizing such a phase difference detector.

2. Description of the Related Art

Conventionally, a digital computation technique has been known for determining the phase difference between two AC signals of the same frequency. For instance, Japanese Patent No. 3808973 discloses the following method for computing the phase difference between two AC signals: $s_1 = A_1 \cdot \cos(\omega \cdot t)$ and $s_2 = A_2 \cdot \cos(\omega \cdot t + \phi)$, where $\omega = 2\pi \cdot f$, $f$ represents frequency, and $\phi$ represents a phase difference from the signal $s_1$.

(1) A sine (or sinusoidal) wave $s_3 = \cos((\omega + \omega_o) \cdot t)$, $\omega_o = 2\pi \cdot f_o$, having a frequency of $(f + f_o)$[Hz] ($f_o \ll f$) is generated by using a direct digital synthesizer. Then, the sine wave is multiplied by each of the AC signals $s_1$ and $s_2$, whereby the following signals $s_a$ and $s_b$ are obtained.

$$s_a = s_1 \times s_3$$
$$= A_1 \cdot \cos(\omega \cdot t) \cdot \cos((\omega + \omega_o) \cdot t)$$
$$= (A_1/2) \cdot [\cos((2\omega + \omega_o) \cdot t) + \cos(\omega_o \cdot t)]$$

$$s_b = s_2 \times s_3$$
$$= A_2 \cdot \cos(\omega \cdot t + \phi) \cdot \cos((\omega + \omega_o) \cdot t)$$
$$= (A_2/2) \cdot [\cos((2\omega + \omega_o + \phi) \cdot t) + \cos(\omega_o \cdot t + \phi)].$$

(2) Filtering is performed with respect to the signals $s_a$ and $s_b$ to remove frequency components higher than $f_o$, thereby extracting low frequency signals $s_{ao}(A_1/2) \cdot \cos(\omega \cdot t)$ and $s_{bo} = (A_2/2) \cdot \cos(\omega \cdot t + \phi)$ having the frequency $f_o$.

(3) The two low frequency signals $s_{ao}$ and $s_{bo}$ are transformed into rectangular waves, and by using the reference clock of a direct digital synthesizer, the period $T(=1/f_o)$ and the deviation time $t$ of the rise timings of the two low frequency signals $s_{ao}$, $s_{bo}$ are obtained. By computing $360 \times (t/T)[°]$ or $2\pi \times (t/T)[\mathrm{rad}]$, the phase difference $\phi$ is obtained.

In the above technique for computing phase difference disclosed in U.S. Pat. No. 3,808,973, after detected values of two AC signal $s_1$ and $s_2$ having a phase difference $\phi$ are converted into low frequency signal $s_{ao}$ and $s_{bo}$, the period T and the deviation time $t$ of the rise timings of the two low frequency signals $s_{ao}$ and $s_{bo}$ are measured by using a clock of a reference clock, and then the measured values are used to obtain the phase difference $\phi$.

When the frequency of the reference clock is $f_{CLK}$, the period $\tau$ of the reference clock is $\tau = 1/f_{CLK}$, and the period T of the low frequency signals $s_{ao}$, $s_{bo}$ is $T = 1/f_o$. Thus, the resolving power N for measuring the period T is $N = T/\tau = f_{CLK}/f_o$ [times/period]. When the resolving power N is converted into a resolving power B in terms of angle, $B = 360/N = 360 \times f_o/f_{CLK}$ [°] or $B = 2\pi \times f_o/f_{CLK}$[rad]. In this way, since the phase difference $\phi$ is computed by using the period T and the phase deviation time $t$ of the low frequency signals $s_{ao}$, $s_{bo}$ in the conventional phase difference computation method, the accuracy of the computation results depends on the resolving power B.

Specifically, when the ratio of the frequencies $R_f = f_o/f_{CLK}$ is increased, the resolving power B increases, which results in lower detection accuracy. When the ratio Rf is decreased, the resolving power B decreases, which results in higher detection accuracy. Thus, to improve the detection accuracy, it may be considered to set the value of the frequency $f_{CLK}$ of the reference clock high or to set the value of the frequency $f_o$ low. However, since the speed of a device such as a direct digital synthesizer that uses a reference clock for operation or a counter for measuring the period T or the phase deviation time $t$ cannot be increased beyond a certain limit, the frequency $f_{CLK}$ cannot be set to a high value as desired.

On the other hand, since the phase difference $\phi$ is detected at the period $T = 1/f_o$, setting the frequency $f_o$ low leads to long detection intervals. Thus, in the case where the phase difference $\phi$ changes largely when detection is not being performed, the reliability of the detected value is low.

In this way, in the conventional phase difference detection method, the resolving power B depends on the ratio $R_f = f_o/f_{CLK}$ and the detection period $(1/f_o)$ is a trade-off for the resolving power B (detection accuracy), so that it is difficult to set optimum values for the frequency $f_o$ and the frequency $f_{CLK}$ of the reference clock.

SUMMARY OF THE INVENTION

The present invention has been conceived in view of the foregoing situation. It is therefore an object of the present invention to provide a phase difference detector and a phase difference detection program that are capable of detecting phase difference between two AC signals at a high-speed and with high accuracy. Another object of the present invention is to provide a plasma processing system that uses such a phase difference detector and a phase difference detection program.

To solve the above-described problem, the present invention takes the following measures.

According to a first aspect of the present invention, there is provided a phase difference detector for detecting a phase difference between a first AC signal and a second AC signal having a same frequency as a fundamental frequency of the first AC signal. The phase difference detector includes a sine wave generator that generates a sine wave signal having the same frequency as the fundamental frequency, a cosine wave generator that generates a cosine wave signal having the same frequency as the fundamental frequency, a first signal multiplier that multiplies the first AC signal and the sine wave signal, a second signal multiplier that multiplies the first AC signal and the cosine wave signal, a third signal multiplier that multiplies the second AC signal and the sine wave signal, a fourth signal multiplier that multiplies the second AC signal and the cosine wave signal, a DC component extraction unit that extracts four DC components by removing an AC component from a result of multiplication in each of the first through the fourth signal multipliers, a trigonometric function computation unit that obtains a sine value and a cosine value of the phase difference by a computation using the four DC components, and a phase difference computation unit that uses the cosine value and the sine value computed by the trigonometric function computation unit to compute arctangent of a ratio of the sine value to the cosine value to obtain the phase difference.

Preferably, when the first AC signal is $A_1 \cdot \cos(2\pi \cdot f_0 \cdot t + \phi_1) + h_1(t)$ (where $h_1(t)$ is sum of harmonic components) and the second AC signal is $A_2 \cdot \cos(2\pi \cdot f_0 \cdot t + \phi_2) + h_2(t)$ (where $h_2(t)$ is sum of harmonic components) the sine wave signal generated by the sine wave generator and the cosine wave signal generated by the cosine wave generator are expressed as sin$(2\pi \cdot f_0 \cdot t)$ and $\cos(2\pi \cdot f_0 \cdot t)$ respectively, the four DC components extracted by the DC component extraction unit are expressed as $R_1=(A_1/2)\cdot\cos(\phi_1)$, $I_1=(-A_1/2)\cdot\sin(\phi_1)$ $R_2=(A_2/2)\cdot\cos(\phi_2)$ and $I_2=(-A_2/2)\cdot\sin(\phi_2)$, and the trigonometric function computation unit computes $R_1 \times R_2 + I_1 \times I_2$ to obtain a cosine value expressed as $(A_1 \cdot A_2/4)\cdot\cos(\phi_r)$ (where $\phi_r=\phi_2-\phi_1$) and computes $R_2 \times I_1 - R_1 \times I_2$ to obtain a sine value expressed as $(A_1 \cdot A_2/4)\cdot\sin(\phi_r)$.

Preferably, the sine wave generator and the cosine wave generator are provided by a direct digital synthesizer including a first clock generator that generates a first reference clock, a first frequency retaining unit that retains a value of a fundamental frequency of the first AC signal, a first adder that adds the value of a fundamental frequency retained in the first frequency retaining unit and a result of addition and outputs a result every time a clock pulse of the first reference clock is inputted, and a first waveform storing unit that stores a table of wave height values of predetermined sine waves or cosine waves and outputs a wave height value corresponding to the result of addition every time the result of addition is outputted from the first adder.

According to a second aspect of the present invention, there is provided a computer readable storage medium comprising a phase difference detection program encoded and stored in a computer readable format, where the program is configured to cause a computer to function as a phase difference detector for detecting a phase difference between a first AC signal and a second AC signal having a same frequency as a fundamental frequency of the first AC signal. Specifically, the program causes the computer to function as: a sine wave generator that generates a sine wave signal having the same frequency as the fundamental frequency; a cosine wave generator that generates a cosine wave signal having the same frequency as the fundamental frequency; a first signal multiplier that multiplies the first AC signal and the sine wave signal; a second signal multiplier that multiplies the first AC signal and the cosine wave signal; a third signal multiplier that multiplies the second AC signal and the sine wave signal; a fourth signal multiplier that multiplies the second AC signal and the cosine wave signal; a DC component extraction unit that extracts four DC components by removing an AC component from a result of multiplication in each of the first through the fourth signal multipliers; a trigonometric function computation unit that obtains a sine value and a cosine value of the phase difference by a computation using the four DC components; and a phase difference computation unit that uses the cosine value and the sine value computed by the trigonometric function computation unit to compute arctangent of a ratio of the sine value to the cosine value to obtain the phase difference.

According to a third aspect of the present invention, there is provided a plasma processing system for plasma-processing an object by supplying two high-frequency voltages having a same frequency and a phase difference to a pair of electrodes of a plasma chamber. The system includes a phase difference detector as set forth above, an AC voltage detector that detects AC voltages at respective input ends of the paired electrodes and outputs to the phase difference detector one of voltages detected as the first AC signal and the other one of the voltages detected as the second AC signal, an input unit for inputting control values of the frequency and the phase difference, a computation unit that computes difference between the control value of the phase difference inputted by the input unit and a phase difference detected by the phase difference detector, a first high-frequency instruction signal generator that generates, based on the control value of the frequency, a first high-frequency instruction signal having the frequency and a zero phase angle, a second high-frequency instruction signal generator that generates, based on the control value of the frequency and the difference between phase differences computed by the computation unit, a second high-frequency instruction signal having the frequency and a phase angle of the difference between the phase differences, a first high-frequency generator for outputting, based on the first high-frequency instruction signal, a high-frequency voltage having the frequency of the control value and a zero phase angle to one of the paired electrodes, and a second high-frequency generator for outputting, based on the second high-frequency instruction signal, a high-frequency voltage having the frequency of the control value and a phase angle of the difference between phase differences to the other one of the paired electrodes.

Preferably, the first high-frequency instruction signal generator is provided by a direct digital synthesizer including a second clock generator that generates a second reference clock, a second frequency retaining unit that retains a control value of a frequency inputted by the input unit, a second adder that adds the control value of the frequency retained in the second frequency retaining unit and a result of addition and outputs a result every time a clock pulse of the second reference clock is inputted, a second waveform storing unit that stores a table of wave height values of predetermined sine waves or cosine waves and outputs a wave height value corresponding to the result of addition every time the result of addition is outputted from the second adder, and a first signal converter that converts a wave height value outputted from the second waveform storing unit into an analog signal. Preferably, the second high-frequency instruction signal generator is provided by a direct digital synthesizer including a third frequency retaining unit that retains a control value of a frequency inputted by the input unit, a phase difference retaining unit that retains difference between the phase differences computed by the computation unit, a third adder that adds the control value of the frequency retained in the third frequency retaining unit and a result of addition and outputs a result every time a clock pulse of the second reference clock is inputted, a fourth adder that adds the difference between the phase differences retained in the phase difference retaining unit and a result of addition and outputs a result every time a clock pulse of the second reference clock is inputted, a third waveform storing unit that stores a table of wave height values of predetermined sine waves or cosine waves and outputs a wave height value corresponding to the result of addition every time the result of addition is outputted from the fourth adder, and a second signal converter that converts a wave height value outputted from the third waveform storing unit into an analog signal.

According to the phase difference detector of the present invention, a sine wave signal and a cosine wave signal having the same frequency as the fundamental frequency of the first and the second AC signals are generated. Four products are obtained by multiplying the first AC signal and the sine wave signal, the first AC signal and the cosine wave signal, the second AC signal and the sine wave signal, the second AC signal and the sine wave signal. After four DC components are extracted by removing an AC component from each of the products, the four DC components are subjected to predetermined computation processing, whereby a cosine value and a sine value of the phase difference are obtained. Then, arctangent of a ratio of the sine value to the cosine value is computed, whereby the phase difference is obtained.

For instance, when the first AC signal $v_1$ is $v_1 = A_1 \cdot \cos(2\pi \cdot f_0 \cdot t + \phi_1) + h_1(t)$ (where $h_1(t)$ is the sum of harmonic components) and the second AC signal $v_2$ is $V_2 = A_2 \cdot \cos(2\pi \cdot f_0 \cdot t + \phi_2) + h_2(t)$ (where $h_2(t)$ is the sum of harmonic components), the sine wave signal is expressed as $\sin(2\pi \cdot f_0 \cdot t)$, whereas the cosine wave signal is expressed as and $\cos(2\pi \cdot f_0 \cdot t)$. Thus, when the computations $v_{1c} = v_1 \times v_c$, $v_{1s} = v_1 \times v_s$, $v_{2c} = v_2 \times v_c$, $v_{2s} = v_2 \times v_s$, are performed and AC components are removed from the computation results $v_{1c}$, $v_{1s}$, $v_{2c}$, and $v_{2s}$, the DC component of $v_{1c}$ $R_1 = (A_1/2) \cdot \cos(\phi_1)$ the DC component of $v_{1s}$ $I_1 = (-A_1/2) \cdot \sin(\phi_1)$, the DC component of $v_{2c}$ $R_2 = (A_2/2) \cdot \cos(\phi_2)$ and the DC component of $v_{2s}$ $I_2 = (-A_2/2) \cdot \sin(\phi_2)$ are obtained.

Then, the cosine value $R_3$ expressed as $(A_1 \cdot A_2/4) \cdot \cos(\phi_r)$ ($\phi_r = \phi_2 - \phi_1$) is obtained by the computation of $R_3 = R_1 \times R_2 + I_1 \times I_2$, and the sine value $I_3$ expressed as $(A_1 \cdot A_2/4) \cdot \sin(\phi_r)$ is obtained by the computation of $I_3 = I_1 \times R_2 \times R_1 \times I_2$. By further computing $\tan^{-1}(I_3/R_3)$, the phase difference $\phi_r$ is obtained.

Unlike the conventional phase difference computation method, the process of computing the phase difference $\phi r (= \phi_2 - \phi_1)$ in the phase difference detector according to the present invention does not include parameters of the period $(1/f_o)$ and the resolving power B (detection accuracy). Thus, the problem that the period $(1/f_o)$ becomes a trade-off for the resolving power B (detection accuracy) is avoided. Thus, the phase difference $\phi$ is detected at a high speed and with high accuracy.

In the plasma processing system of the present invention, the actual phase difference between two high frequency voltages applied to a pair of electrodes is detected, and the detection result is fed back so that the phase difference between the high frequency voltages is controlled to a control value. According to this arrangement, the actual phase difference is detected at a high speed and with high accuracy by the phase difference detector of the present invention, so that the actual phase difference between the two high frequency voltages applied to the paired electrodes is stably controlled to a control value. This allows stable control of plasma processing.

DETAILED DESCRIPTION OF THE PREFERRED EMBODIMENTS

Preferred embodiments of the present invention are described below with reference to accompanying drawings.

Figure 1:
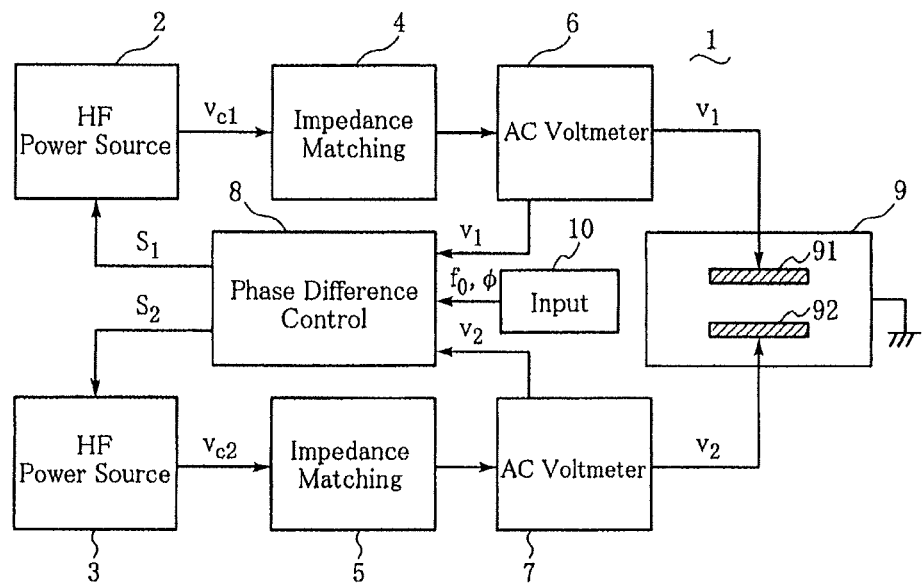
FIG. 1 shows the structure of a plasma processing system that uses a phase difference detector according to the present invention.

FIG. 1 shows the structure of a plasma processing system that uses a phase difference detector according to the present invention.

The plasma processing system 1 is a system for performing processing such as plasma etching by supplying a high frequency electric power to a processing object such as a semiconductor wafer or a liquid crystal substrate. The plasma processing system 1 is made up of two high-frequency power source unit 2 and 3, two impedance matching apparatuses 4 and 5, two AC voltmeters 6 and 7, a phase difference control unit 8, a plasma chamber 9 as a load, and an input device 10.

The plasma processing system 1 performs plasma processing of a processing object by supplying high frequency voltages having a predetermined phase difference $\phi$ to a pair of electrodes 91 and 92 in the plasma chamber 9. The high-frequency power source unit 2 and the impedance matching apparatus 4 constitute a first high-frequency supply unit for supplying a first high-frequency voltage of a frequency $f_0$ to the first electrode 91. The high-frequency power source unit 3 and the impedance matching apparatus 5 constitute a second high-frequency supply unit for supplying, to the second electrode 92, a second high-frequency voltage of a frequency $f_0$ which has a shift of a phase difference $\phi$ relative to the first high-frequency voltage.

The impedance matching apparatus 4 matches the output impedance of the high-frequency power source unit 4 with the impedance of the plasma chamber 9 (i.e., the load impedance looking from the connection end of the electrode 91 toward the plasma chamber 9 side). Though not illustrated, each of the impedance matching apparatuses 4 and 5 is provided with a mechanism for automatically adjusting a variable reactance element for impedance matching while monitoring the reflection coefficient at the end connected with the high-frequency power source unit 2 or 3. During the plasma processing, the impedance matching apparatus 4, 5 performs automatic matching operation to make the reflection coefficient at the end connected with the high-frequency power source unit 2, 3 as small as possible. Thus, each of the high frequency voltages outputted from the high-frequency power source unit 2, 3 is supplied to the first electrode 91 and the second electrode 92 of the plasma chamber 9, with the power loss reduced as much as possible.

The AC voltmeters 6, 7 and the phase difference control unit 8 use the measured values $v_1$ and $v_2$ of the high frequency voltages supplied to the first and the second electrodes 91, 92, and the frequency $f_0$ and phase difference $\phi$ set in the phase difference control unit 8 by external input, to generate a first high-frequency instruction signal $S_1$ for the high-frequency power source unit 2 and a second high-frequency instruction signal $S_2$ for the high-frequency power source unit 3 and feed back the high-frequency instruction signals $S_1$ and $S_2$ to the high-frequency power source unit 2 and the high-frequency power source unit 3, respectively.

The high-frequency power source unit 2 generates a high frequency voltage $v_{c1}$ having an amplitude $A_1$ based on the first high-frequency instruction signal $S_1 = \cos(2\pi \cdot f_0 \cdot t)$ inputted from the phase difference control unit 8, and supplies the voltage to the first electrode 91 of the plasma chamber 9 via the impedance matching apparatus 4. Similarly, based on the second high-frequency instruction signal $S_2 = \cos(2\pi \cdot f_0 \cdot t + \phi')$ ($\phi'$: a value determined such that the difference $\Delta\phi$ between the control value $\phi$ and the actual phase difference $\phi_r$ gradually approaches 0) inputted from the phase difference control unit 8, the high-frequency power source unit 3 generates a high frequency voltage $v_{C2}$ having an amplitude $A_2$ and supplies the voltage to the second electrode 92 of the plasma chamber 9 via the impedance matching apparatus 4.

By the feedback control using the first and the second high-frequency instruction signals $S_1$ and $S_2$ by the AC voltmeters 6, 7 and the phase difference control unit 8, the high frequency voltage supplied to the first electrode 91 of the plasma processing system 1 and the high frequency voltage supplied to the second electrode 92 of the plasma processing system 1 are controlled to respective control values (target values) $v_1$ and $v_2$ determined by external input.

Thus, even when a high frequency voltage $v_{C1}$ is outputted from the high-frequency power source unit 2, a phase angle $\phi_1$ is generated by the transmission path including the impedance matching apparatus 4 between the high-frequency power source unit 2 and the first electrode 91. Thus, when the loss of amplitude is not taken into consideration, a high frequency voltage $v_1 = A_1 \cdot \cos(2\pi \cdot f_0 \cdot t + \phi_1)$ is supplied to the first electrode 91. Similarly, even when a high frequency voltage $v_{C2}$ is outputted from the high-frequency power source unit 3, a phase angle $\phi_2$ is generated by the transmission path including the impedance matching apparatus 4 between the high-frequency power source unit 3 and the second electrode 92. Thus, when the loss of amplitude is not taken into consideration, the high frequency voltage $v_2 = A_2 \cdot \cos(2\pi \cdot f_0 \cdot t + \phi_2)$ is supplied to the second electrode 92.

The phase difference (actual phase difference) $\phi_r$ between the high frequency voltage $v_1$ and the high frequency voltage $v_2$ is $\phi_r = (\phi_2 - \phi_1)$. The phase difference control unit 8 uses the measured values $v_1$ and $v_2$ of the high frequency voltages obtained by the AC voltmeters 6, 7 and a sine wave and a cosine wave generated in it, to compute the difference $\Delta\phi = \phi - \phi_r$ between the actual phase difference $\phi_r$ and the phase difference control value $\phi$. Using the value computed in this way, the phase difference control unit 8 generates a first high-frequency instruction signal $S_1$ and a second high-frequency instruction signal $S_2$ and inputs the first high-frequency instruction signal $S_1$ and the second high-frequency instruction signal $S_2$ into the first high-frequency power source unit 2 and the second high-frequency power source unit 3, respectively.

The phase difference control unit 8 is made up of a microcomputer including a CPU (central processing unit), a ROM (read only memory) and a RAM (random access memory). The computation of the difference $\Delta\phi$ between phase differences and the generation of the first and the second high-frequency instruction signals $S_1$ and $S_2$ are performed by execution of a predetermined program by the microcomputer. The phase difference control unit 8 can be provided by a FPGA (Field Programmable Gate Array).

The phase difference control unit 8 computes the actual phase difference $\phi_r$ by a phase difference computation method according to the present invention. Of the phase difference control unit 8, the portion that computes the phase difference $\phi_r$ corresponds to the phase difference detector according to the present invention.

The method for computing the actual phase difference $\phi_r$ according to the present invention is described below.

The high frequency voltage $v_1(t) = A_1 \cdot \cos(2\pi \cdot f_0 \cdot t + \phi_1) + h_1(t)$ (where $h_1(t)$ represents the sum of harmonic components) detected by the AC voltmeter 6 and the high frequency voltage $v_2(t) = A_2 \cdot \cos(2\pi \cdot f_0 \cdot t + \phi_2) + h_2(t)$ (where $h_2(t)$ represents the sum of harmonic components) detected by the AC voltmeter 7 are subjected to analog-to-digital conversion, whereby discrete-time signals are obtained which are expressed as:

$$v_1[k] = A_1 \cdot \cos(2\pi \cdot f_0 \cdot k + \phi_1) + h_1[k]$$

$$v_2[k] = A_2 \cdot \cos(2\pi \cdot f_0 \cdot k + \phi_2) + h_2[k].$$

By direct digital synthesizers (DDS), a cosine wave $v_c[k] = \cos(2\pi \cdot f_0 \cdot k)$ and a sine wave $v_s[k] = \sin(2\pi \cdot f_0 \cdot k)$ of a fundamental wave component of $v_1[k]$ and $v_2[k]$ are generated, and discrete-time signals $v_{1c}[k]$, $v_{2c}[k]$, $v_{1s}[k]$ and $v_{2s}[k]$ are computed by the computations below:

$$v_{1c}[k] = v_1[k] \times v_c[k] \tag{1}$$

$$v_{2c}[k] = v_2[k] \times v_c[k] \tag{2}$$

$$v_{1s}[k] = v_1[k] \times v_s[k] \tag{3}$$

$$v_{2s}[k] = v_2[k] \times v_s[k] \tag{4}$$

Applying the addition theorem of trigonometric functions to the above formulae (1)-(4) gives the following:

$$v_{1c}[k] = (A_1/2) \cdot (\cos(\phi_1) + \cos(4\pi \cdot f_0 \cdot k + \phi_1)) + h_1[k] \cdot \cos(2\pi \cdot f_0 \cdot k) \tag{5}$$

$$v_{2c}[k] = (A_2/2) \cdot (\cos(\phi_2) + \cos(4\pi \cdot f_0 \cdot k + \phi_2)) + h_2[k] \cdot \cos(2\pi \cdot f_0 \cdot k) \tag{6}$$

$$v_{1s}[k] = (A_1/2) \cdot (-\sin(\phi_1) + \sin(4\pi \cdot f_0 \cdot k + \phi_1)) + h_1[k] \cdot \sin(2\pi \cdot f_0 \cdot k) \tag{7}$$

$$v_{2s}[k] = (A_2/2) \cdot (-\sin(\phi_2) + \sin(4\pi \cdot f_0 \cdot k + \phi_2)) + h_2[k] \cdot \sin(2\pi \cdot f_0 \cdot k) \tag{8}$$

As will be understood from the above formulae (5)-(8), the discrete-time signals $v_{1c}[k]$, $v_{2c}[k]$, $v_{1s}[k]$, $v_{2s}[k]$ are composite waves of the DC component and the AC components. Thus, subjecting the discrete-time signals $v_{1c}[k]$ $v_{2c}[k]$ $v_{1s}[k]$ and $v_{2s}[k]$ to filtering for removing AC components (filtering by a low-pass filter) provides four discrete-time signals, which are a sine wave and a cosine wave having a phase angle $\phi_1$, and a sine wave and a cosine wave having a phase angle $\phi_2$. Each of these discrete-time signals has a value that does not relate to the discrete-time (sampling number k).

When a sine wave and a cosine wave having a phase angle $\phi_1$ are $R_1 = (A_1/2) \cdot \cos(\phi_1)$, $I_1 = (-A_1/2) \cdot \sin(\phi_1)$ and a sine wave and a cosine wave having a phase angle $\phi_2$ are $R_2 = (A_2/2) \cdot \cos(\phi_2)$ $I_2 = (-A_2/2) \cdot \sin(\phi_2)$, $$\begin{aligned} R_3 &= R_1 \times R_2 + I_1 \times I_2 \\ &= (A_1 \cdot A_2/4)[\cos(\phi_1) \cdot \cos(\phi_2) + \sin(\phi_1) \cdot \sin(\phi_2)] \\ &= (A_1 \cdot A_2/4) \cdot \cos(\phi_2 - \phi_1) \\ &= (A_1 \cdot A_2/4) \cdot \cos(\phi_r) \end{aligned} \tag{9}$$

$$\begin{aligned} I_3 &= R_2 \times I_1 - R_1 \times I_2 \\ &= (A_1 \cdot A_2/4)[-\sin(\phi_1) \cdot \cos(\phi_2) + \cos(\phi_1) \cdot \sin(\phi_2)] \\ &= (A_1 \cdot A_2/4) \cdot \sin(\phi_2 - \phi_1) \\ &= (A_1 \cdot A_2/4) \cdot \sin(\phi_r) \end{aligned} \tag{10}$$

Since $I_3/R_3 = \tan(\phi_r)$, the phase difference $\phi_r$ is obtained by the formula $$\phi_r = \tan^{-1}(I_3/R_3) \tag{11}$$

The structure of the phase difference control unit 8 is described below.

Figure 2:
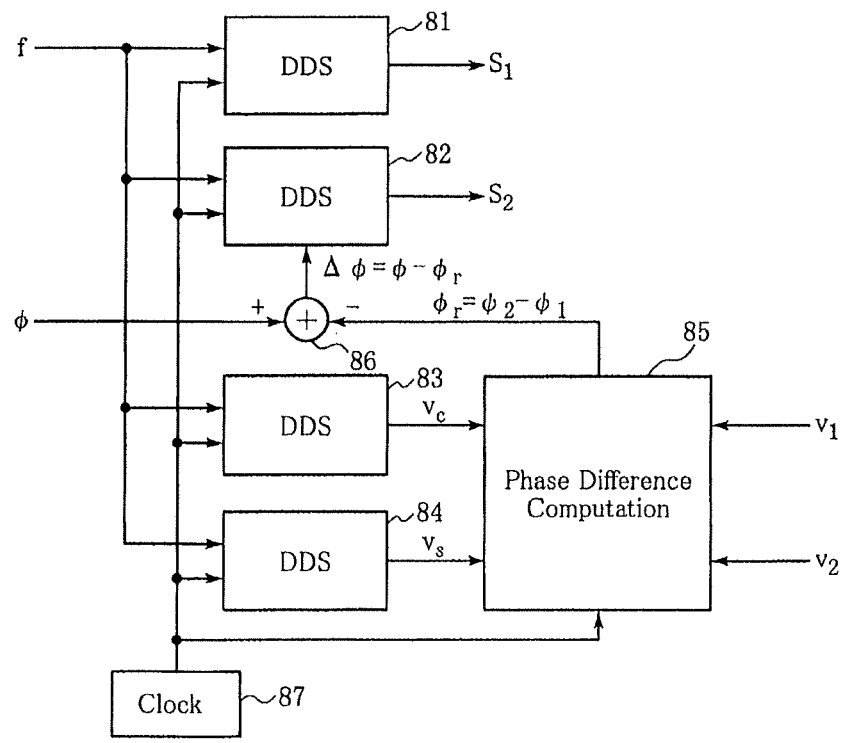
FIG. 2 is a block diagram showing the computing function of a phase difference control unit.

FIG. 2 is a block diagram showing the computation function of the phase difference control unit 8.

The phase difference control unit 8 includes a first signal generating unit 81 for generating a first high-frequency instruction signal $S_1$, a second signal generating unit 82 for generating a second high-frequency instruction signal $S_2$, a third signal generating unit 83 for generating a cosine wave signal $v_c$ having an output frequency $f_0$ of the high-frequency power source units 2, 3 which is inputted as a control value from the input device 10, a fourth signal generating unit 84 for generating a sine wave signal $v_s$ having the output frequency $f_0$, a phase difference computation unit 85 for computing the phase difference $\phi_r$ between the high frequency voltage $v_1$ and the high frequency voltage $v_2$ detected by the AC voltmeters 6 and 7, an adder 86 for computing the difference $\Delta\phi$ between the phase difference $\phi$ inputted as a control value from the input device 10 and the phase difference $\phi_r$ computed by the phase difference computation unit 85, and a clock 87 for generating a reference clock.

The phase difference control unit 8 is provided with the input device 10 and a non-illustrated display unit. By using the input device 10 and the display unit, the user can set the frequency $f_0$ (control value) of the high frequency voltages outputted from the high-frequency power source units 2 and 3 and the phase difference φ (control value) between the output voltage $v_{c1}$ from the high-frequency power source unit 2 and the output voltage $v_{c2}$ from the high-frequency power source unit 3. For instance, the frequencies often used in plasma processing systems, such as 2.0[MHz] or 13.56[MHz], may be set in the phase difference control unit 8 as the frequency $f_0$. The frequency $f_0$ inputted from the input device 10 is inputted into the first through the fourth signal generating units 81-84, and the phase difference φ inputted from the input device 10 is inputted into the adder 86.

Figure 3:
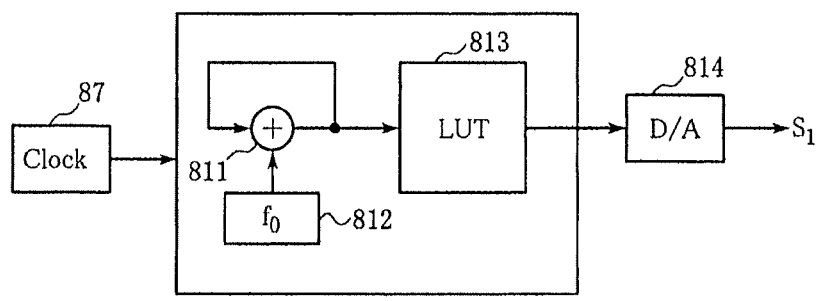
FIG. 3 is a block diagram of a first signal generating unit.

The first signal generating unit 81 may be provided by a direct digital synthesizer (DDS) as shown in FIG. 3 as a block diagram.

The DDS is a signal generator including, as its basic structural elements, a look-up table for storing waveform data obtained by sampling wave height values of basic waveforms (such as a sine wave, a triangular wave or a rectangular wave) of one period by predetermined bits, a phase accumulator for generating the phase of a desired frequency at an arbitrary time, and a digital-to-analog converter. The DDS reads out a wave height value corresponding to the phase generated by the phase accumulator from the look-up table to generate the wave height value data of a desired frequency, and subjects the wave height value data to digital-to-analog conversion to generate a signal of a desired frequency.

The first signal generating unit 81 shown in FIG. 3 is basically made up of an adder 811, a frequency setting register 812, a look-up table (LUT) 813 and a digital-to-analog converter 814. The look-up table 813 stores wave height value data of cosine waves by predetermined bits. The digital value of a frequency $f_o$ inputted by the input device 10 is set in the frequency setting register 812.

Every time a clock pulse of a reference clock is inputted from the clock 87 (at the rise time or fall time of a reference clock), the adder 811 adds the value of the frequency $f_o$ set in the frequency setting register 812 and the result of the preceding addition by the adder 811 and outputs the result of addition to the look-up table 813 as address data. Thus, the clock 87, the adder 811 and the frequency setting register 812 function as a phase accumulator.

Every time address data is inputted from the adder 811, the look-up table 813 reads out the wave height value data corresponding to the address data and outputs the wave height value data to the digital-to-analog converter 814. The digital-to-analog converter 814 converts the wave height value data into an analog signal. The analog signal outputted from the digital-to-analog converter 814 is caused to pass through a low-pass filter and an amplifier (not shown) where unnecessary frequency components are removed and the amplitude level is adjusted, and then outputted as a first high-frequency instruction signal $S_1$. The first high-frequency instruction signal $S_1$ is expressed as $S_1=\cos(2\pi \cdot f_0 \cdot t)$ (amplitude is normalized to 1).

Figure 4:
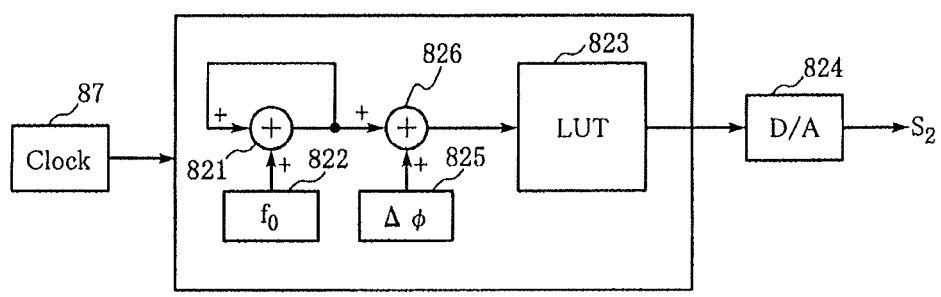
FIG. 4 is a block diagram of a second signal generating unit.

The second signal generating unit 82 may be provided by a direct digital synthesizer (DDS) as shown in FIG. 4 as a block diagram. The DDS shown in this figure includes, as its basic structural elements, adders 821 and 826, a frequency setting register 822, a look-up table (LUT) 823, a digital-to-analog converter 824 and a phase difference setting register 825. The adder 821, the frequency setting register 822, the look-up table 823 and the digital-to-analog converter 824 correspond to the adder 811, the frequency setting register 812, the look-up table 813 and the digital-to-analog converter 814, respectively, of the first signal generating unit 81 and have the same functions as these. Similarly to the frequency setting register 812, the digital value of the frequency $f_o$ inputted by the input device 10 is set in the frequency setting register 822. The look-up table 823 stores the same wave height value data as the look-up table 813.

Thus, the difference of the DSS of the second signal generating unit 82 shown in FIG. 4 from the DDS of the first signal generating unit 81 shown in FIG. 3 is that it additionally includes a phase difference setting register 825 and an adder 826. The difference between phase differences Δφ=φ−$φ_r$ computed by the adder 86 shown in FIG. 2 is set in the phase difference setting register 825. The adder 826 adds the difference Δφ between phase differences, which is set in the phase difference setting register 825, to the result of addition by the adder 822, and outputs the result of addition to the look-up table 823 as address data. Thus, in the second signal generating unit 82, the adders 821 and 826, the frequency setting register 822 and the phase difference setting register 825 function as a phase accumulator.

In the second signal generating unit 82, every time a clock pulse of a reference clock is inputted from the clock 87, the adder 821 adds the value of the frequency $f_o$ set in the frequency setting register 822 and the result of the preceding addition by the adder 821. Further, to the result of this addition by the adder 822, the adder 826 adds the difference 4 between phase differences which is set in the phase difference setting register 825. The adder 826 outputs the result of addition to the look-up table 823 as address data.

The result of the addition by the adder 826 is the sum of the result of addition by the adder 821 and the difference Δφ between phase differences. Thus, the phase of the wave height value data outputted from the look-up table 823 in accordance with the result of the addition by the adder 826 as the address data is delayed by Δφ from the phase of the wave height value data outputted from the look-up table 813 of the first signal generating unit 81. Thus, the second high-frequency instruction signal $S_2$, which is generated by subjecting the analog signal outputted from the digital-to-analog converter 824 to removal of unnecessary frequency components by a low-pass filter (not shown) and amplitude level adjustment by an amplifier (not shown), is expressed as $S_2=\cos(2\pi \cdot f_0 \cdot t + \Delta\phi)$ (amplitude is normalized to 1).

The third signal generating unit 83 is provided by a DDS having a similar structure to the first signal generating unit 81 shown in FIG. 3. The third signal generating unit 83 operates similarly to the first signal generating unit 81 to generate a cosine wave signal $v_c$. Since the cosine wave signal $v_c$ generated by the third signal generating unit 83 is inputted into the phase difference computation unit 85 and used for the above-described digital computation of the formulae (1) and (2), the DDS of the third signal generating unit 83 does not include a digital-to-analog converter. Thus, in the third signal generating unit 83, the wave height value data outputted from the look-up table is outputted as the cosine wave signal $v_c$. The cosine wave signal $v_c$ is expressed as $v_c[k]=\cos(2\pi \cdot f_0 \cdot k)$ (amplitude is normalized to 1).

The fourth signal generating unit 84 is provided by a DDS having a similar structure to the third signal generating unit 83. The fourth signal generating unit 84 operates similarly to the third signal generating unit 83 to generate a sine wave signal $v_s$. Since the fourth signal generating unit 84 generates a sine wave signal $v_s$, wave height value data of sine waves (wave height value data whose phase is delayed by 90° from the cosine waves stored in the look-up table 813) is stored in the look-up table, which is the difference from the third signal generating unit 83. The sine wave signal $v_s$ outputted from the fourth signal generating unit 84 is expressed as $v_s[k]=\sin(2\pi \cdot f_0 \cdot k)$ (amplitude is normalized to 1).

The fourth signal generating unit 84 may be provided by a DDS having a similar structure to the second signal generating unit 82. In this case, the same cosine wave height value data as those stored in the look-up table 813 is stored in the look-up table, and appropriate phase difference data for a 90° phase delay is set in the phase difference setting register 825. With this arrangement, the phase data outputted from the adder 821 is delayed by 90° by the phase difference setting register 825 and the adder 826, so that the phase read out from the look-up table 823 is delayed by 90°. Thus, the wave height value of the cosine wave read out from the look-up table 824 substantially becomes the wave height value of a sine wave.

Figure 5:
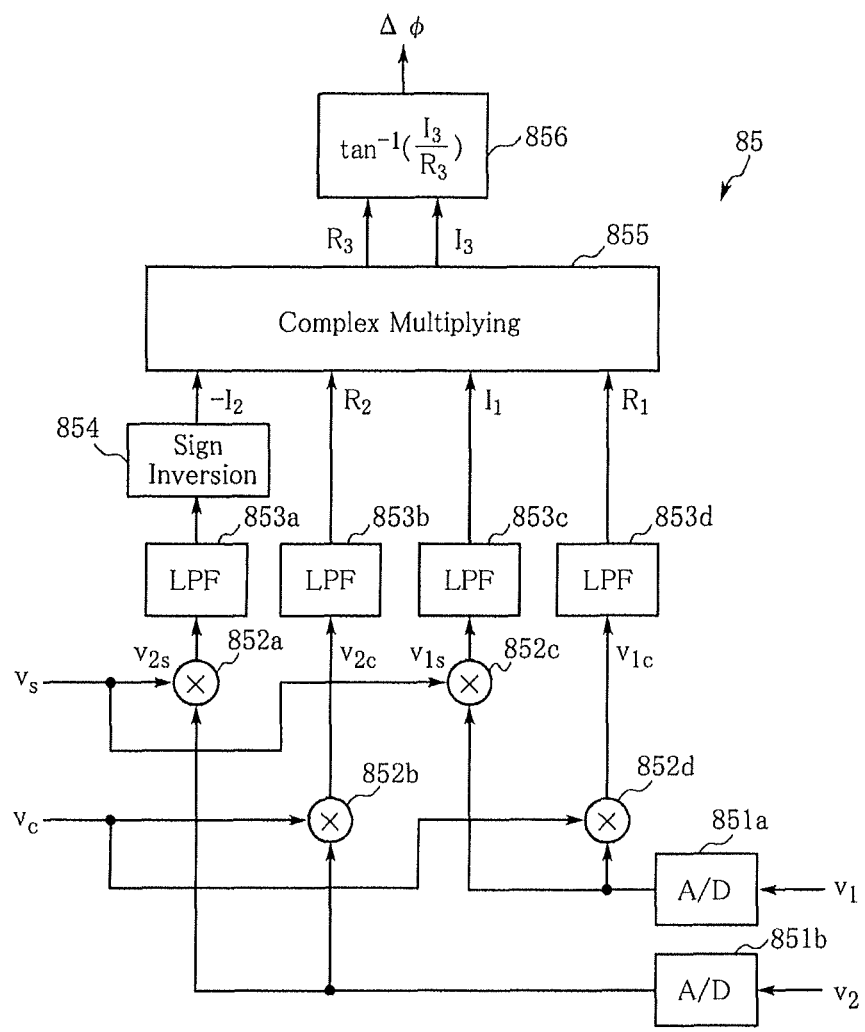
FIG. 5 is a block diagram showing the internal structure of a phase difference computation unit.

FIG. 5 is a block diagram showing the internal structure of the phase difference computation unit 85 shown in FIG. 2.

The phase difference computation unit 85 includes two analog-to-digital converters 851*a* and 851*b*, four multipliers 852*a*, 852*b*, 852*c* and 852*d*, four low-pass filters 853*a*, 853*b*, 853*c* and 853*d*, a sign inversion unit 854, a complex multiplying unit 855 and arctangent calculation unit 856. Though not illustrated, a reference clock outputted from a clock that is common to the clocks 811 and 821 is inputted into the phase difference computation unit 85 as well. Based on the reference clock, the phase difference computation unit 85 performs the processing for computing the difference $4c1$) between phase differences in synchronism with the wave height value data generation operation by the first through the fourth signal generating units 81-84.

The analog-to-digital converter 851*a* converts the voltage $v_1(t)=A_1 \cdot \cos(2\pi \cdot f_0 \cdot t+\phi_1)+h_1(t)$ detected by the AC voltmeter 6 into a digital signal detection voltage $[k]=A_1 \cdot \cos(2\pi \cdot f_0 \cdot k+\phi_1)+h_1[k]$. The analog-to-digital converter 851*b* converts the voltage $v_2(t)=A_2 \cdot \cos(2\pi \cdot f_0 \cdot t+\phi_2)+h_2(t)$ detected by the AC voltmeter 7 into a digital signal detection voltage $v_2[k]=A_2 \cdot \cos(2\pi \cdot f_0 \cdot k+\phi_2)+h_2[k]$.

The multiplier 852*a* multiplies the cosine wave signal $v_s[k]$ generated by the fourth signal generating unit 84 with a detection voltage $v_2[k]$ of the AC voltmeter 7 outputted from the analog-to-digital converter 851*b* to obtain $v_{2s}[k]$ of the formula (8). The multiplier 852*b* multiplies the sine wave signal $v_c[k]$ generated by the third signal generating unit 83 with a detection voltage $v_2[k]$ of the AC voltmeter 7 outputted from the analog-to-digital converter 851*b* to obtain $v_{2c}[k]$ of the formula (6). The multiplier 852*c* multiplies the cosine wave signal $v_s[k]$ generated by the fourth signal generating unit 84 with a detection voltage $v_1[k]$ of the AC voltmeter 6 outputted from the analog-to-digital converter 851*a* to obtain $v_{1s}[k]$ of the formula (7). The multiplier 852*d* multiplies the sine wave signal $v_c[k]$ generated by the third signal generating unit 83 with a detection voltage $v_1[k]$ of the AC voltmeter 6 outputted from the analog-to-digital converter 851*a* to obtain $v_{1c}[k]$ of the formula (5).

The low-pass filter 853*a* removes an AC component from the signal $v_{2s}[k]$ outputted from the multiplier 852*a* to extract a sine wave $I_2=(-A_2/2) \cdot \sin(\phi_2)$. The low-pass filter 853*b* removes an AC component from the signal $v_{2c}[k]$ outputted from the multiplier 852*b* to extract a cosine wave $R_2=(A_2/2) \cdot \cos(\phi_2)$. The cosine wave $R_2$ outputted from the low-pass filter 853*b* is inputted as it is into the complex multiplying unit 855. The sine wave $I_2$ outputted from the low-pass filter 853*a* is inputted into the complex multiplying unit 855 after its sign is inverted to $-I_2$ by the sign inversion unit 854.

The low-pass filter 853*c* removes an AC component from the signal $v_{1s}[k]$ outputted from the multiplier 852*c* to extract a sine wave $I_1=(-A_1/2) \cdot \sin(\phi_1)$. The low-pass filter 853*d* removes an AC component from the signal $v_{1c}[k]$ outputted from the multiplier 852*b* to extract a cosine wave $R_1=(A_1/2) \cdot \cos(\phi_1)$. The sine wave $I_1$ and the cosine wave $R_1$ outputted from the low-pass filters 853*c* and 853*d* are inputted into the complex multiplying unit 855.

The complex multiplying unit 855 performs multiplication of complex numbers. That is, when two complex numbers $\alpha$ and $\beta$ are $\alpha = R_1+j \cdot I_1$ and $\beta = R_2-j \cdot I_2$, $\alpha \times \beta = (R_1 \times R_2 + I_1 \times I_2) + j \cdot (R_2 \times I_1 - R_1 \times I_2)$. Thus, the complex multiplying unit 855 performs computation of real part $(R_1 \times R_2 + I_1 \times I_2)$ and imaginary part $(R_2 \times I_1 - R_1 \times I_2)$ of $\alpha \times \beta$. As described above, the real part $(R_1 \times R_2 + I_1 \times I_2)$ of $\alpha \times \beta$ is the computation of the formula (9), whereas the imaginary part $(R_2 \times I_1 - R_1 \times I_2)$ of $\alpha \times \beta$ is the computation of the formula (10). Thus, the complex multiplying unit 855 computes $R_3$ of the formula (9) and $I_3$ of the formula (10) and inputs the results into the arctangent calculation unit 856.

In the arctangent calculation unit 856, the arithmetic expression of the arctangent $\tan^{-1}(I_3/R_3)$ with the argument $(I_3/R_3)$ is set. The arctangent calculation unit 856 calculates the arctangent by substituting the real part $R_3$ and the imaginary part $I_3$ inputted from the complex multiplying unit 855 for the argument of $\tan^{-1}(I_3/R_3)$, thereby calculating the phase difference $\phi_r$ of the formula (11). The phase difference $\phi_r$ calculated by the arctangent calculation unit 856 is inputted into the adder 86. In the adder 86, the difference $\Delta \phi = \phi - \phi_r$, i.e., the difference from the phase difference control value $\phi$ inputted from the input device 10, is computed. As shown in FIGS. 2 and 4, this computation result is inputted into the phase difference setting register 825 of the second signal computation unit 82.

In the plasma processing system 1 of this embodiment, in starting the system, the phase difference control unit 8 outputs a first high-frequency instruction signal $S_1 = \cos(2\pi \cdot f_0 \cdot t)$ to the high-frequency power source unit 2 and outputs a second high-frequency instruction signal $S_2 - \cos(2\pi \cdot f_0 \cdot t + \Delta \phi)$ to the high-frequency power source unit 3.

The high-frequency power source unit 2 outputs a high frequency voltage $v_{C1}$ of an amplitude $A_1$ based on the first high-frequency instruction signal $S_1$, whereas the high-frequency power source unit 3 outputs a high frequency voltage $v_{C2}$ of an amplitude $A_2$ based on the second high-frequency instruction signal $S_2$. The high frequency voltage $v_{c1}$ outputted from the high-frequency power source unit 2 is supplied to the first electrode 91 of the plasma chamber 9 via the impedance matching apparatus 4. In this process, the phase changes in the impedance matching apparatus 4 or the transmission path between the high-frequency power source unit 2 and the first electrode 91, so that a high frequency voltage $v_1 = A_1 \cdot \cos(2\pi \cdot f_0 \cdot t + \phi_1)$ is supplied to the first electrode 91. Similarly, a high frequency voltage $v_2 = A_2 \cdot \cos(2\pi \cdot f_0 \cdot t + \phi_2)$ is supplied to the second electrode 92.

The high frequency voltage $v_1$ supplied to the first electrode 91 and the high frequency voltage $v_2$ supplied to the second electrode 92 are detected by the AC voltmeters 6 and 7, respectively, and inputted into the phase difference control unit 8. The phase difference control unit 8 uses the detected values of the high frequency voltages $v_1$, $v_2$ and the frequency $f_0$ and phase difference $\phi$ set by the input device 10 to perform computation of the above-described formulae (1)-(4). Then, filtering is performed to remove AC components from these computation results to extract DC components only. By conducting computations of the formulae (9)-(11) by using the extracted values, the phase difference $\phi_r$ between the high frequency voltage $v_1$ and the high frequency voltage $v_2$ is computed.

The phase difference control unit 8 further computes the difference $\Delta\phi$ between the phase value control value $\phi$ set from the input device 10 and the actual phase difference and feeds back the difference $\Delta\phi$ to the second signal generating unit 82 for generating a second high-frequency instruction signal $S_2$. Thus, the second high-frequency instruction signal $S_2 = \cos(2\pi \cdot f_0 \cdot t + \Delta\phi)$ in which deviation from the control value $\phi$ is corrected is generated. The correction processing of the second high-frequency instruction signal $S_2$ by the phase difference control unit 8 is performed in the period of the reference clock generated by the reference clocks 811, 821. Thus, the phase difference (actual phase difference) $\phi_r$ between the first high frequency voltage $v_1$ supplied to the first electrode 91 and the second high frequency voltage $v_2$ supplied to the second electrode 92 is stably controlled to the control value $\phi$ by the phase difference control unit 8.

As described above, in this embodiment, $R_3$ corresponding to the real part and $I_3$ corresponding to the imaginary part of multiplication of two complex numbers $\alpha$ and $\beta$ are obtained by the formulae (9) and (10), and the phase difference $\phi_r$ is obtained by calculating the arctangent shown as the formula (11) by using the values $R_3$ and $I_3$. Thus, unlike the conventional phase difference detection method, the problem that the detection period $(1/f_o)$ becomes a trade-off for the resolving power B (detection accuracy) is avoided.

Thus, the phase difference $\phi_r$ is detected at a high speed and with high accuracy, and the phase difference between the first high frequency voltage $v_1$ supplied to the first electrode 91 and the second high frequency voltage $v_2$ supplied to the second electrode 92 is stably controlled to the control value $\phi$. This assures that stable control of plasma generation between the first electrode 91 and the second electrode 92 is performed at a high speed and with high accuracy.

Although explanation is given in the foregoing embodiment as to the case where the phase difference detector according to the present invention is applied to a phase difference control unit of a plasma processing system in which two high frequency voltages $V_1$ and $V_2$ are supplied to the plasma chamber with the same frequency $f_0$ and a predetermined phase difference $\phi$, the phase difference detector according to the present invention is applicable to systems other than a plasma processing system.

The invention claimed is:

1. A phase difference detector for detecting a phase difference between a first AC signal and a second AC signal having a same frequency as a fundamental frequency of the first AC signal, the detector comprising:
    a sine wave generator that generates a sine wave signal having the same frequency as the fundamental frequency;
    a cosine wave generator that generates a cosine wave signal having the same frequency as the fundamental frequency;
    a first signal multiplier that multiplies the first AC signal and the sine wave signal;
    a second signal multiplier that multiplies the first AC signal and the cosine wave signal;
    a third signal multiplier that multiplies the second AC signal and the sine wave signal;
    a fourth signal multiplier that multiplies the second AC signal and the cosine wave signal;
    a DC component extraction unit that extracts four DC components by removing an AC component from a result of multiplication in each of the first through the fourth signal multipliers;
    a trigonometric function computation unit that obtains a sine value and a cosine value of the phase difference by a computation using the four DC components; and
    a phase difference computation unit that uses the cosine value and the sine value computed by the trigonometric function computation unit to compute arctangent of a ratio of the sine value to the cosine value to obtain the phase difference,
    wherein:
        when the first AC signal is $A_1 \cdot \cos(2\pi \cdot f_0 \cdot t + \phi_1) + h_1(t)$ (where $h_1(t)$ is the sum of harmonic components) and the second AC signal is $A_2 \cdot \cos(2\pi \cdot f_0 \cdot t + \phi_2) + h_2(t)$ (where $h_2(t)$ is the sum of harmonic components),
        the sine wave signal generated by the sine wave generator and the cosine wave signal generated by the cosine wave generator are expressed as $\sin(2\pi \cdot f_0 \cdot t)$ and $\cos(2\pi \cdot f_0 \cdot t)$, respectively,
        the four DC components extracted by the DC component extraction unit are expressed as $R_1 = (A_1/2) \cdot \cos(\phi_1)$, $I_1 = (-A_1/2) \cdot \sin(\phi_1)$, $R_2 = (A_2/2) \cdot \cos(\phi_2)$ and $I_2 = (-A_2/2) \cdot \sin(\phi_2)$, and
        the trigonometric function computation unit computes $R_1 \times R_2 + I_1 \times I_2$ to obtain a cosine value expressed as $(A_1 \cdot A_2/4) \cdot \cos(\phi_r)$ (where $\phi_r = \phi_2 - \phi_1$) and computes $R_2 \times I_1 - R_1 \times I_2$ to obtain a sine value expressed as $(A_1 \cdot A_2/4) \cdot \sin(\phi_r)$.

2. A phase difference detector for detecting a phase difference between a first AC signal and a second AC signal having a same frequency as a fundamental frequency of the first AC signal, the detector comprising:
    a sine wave generator that generates a sine wave signal having the same frequency as the fundamental frequency;
    a cosine wave generator that generates a cosine wave signal having the same frequency as the fundamental frequency;
    a first signal multiplier that multiplies the first AC signal and the sine wave signal;
    a second signal multiplier that multiplies the first AC signal and the cosine wave signal;
    a third signal multiplier that multiplies the second AC signal and the sine wave signal;
    a fourth signal multiplier that multiplies the second AC signal and the cosine wave signal;
    a DC component extraction unit that extracts four DC components by removing an AC component from a result of multiplication in each of the first through the fourth signal multipliers;
    a trigonometric function computation unit that obtains a sine value and a cosine value of the phase difference by a computation using the four DC components; and
    a phase difference computation unit that uses the cosine value and the sine value computed by the trigonometric function computation unit to compute arctangent of a ratio of the sine value to the cosine value to obtain the phase difference,
    wherein the sine wave generator and the cosine wave generator are provided by a direct digital synthesizer comprising:
    a first clock generator that generates a first reference clock;
    a first frequency retaining unit that retains a value of a fundamental frequency of the first AC signal;
    a first adder that adds the value of a fundamental frequency retained in the first frequency retaining unit and a result of addition and outputs a result every time a clock pulse of the first reference clock is inputted; and a first waveform storing unit that stores a table of wave height values of predetermined sine waves or cosine waves and outputs a wave height value corresponding to the result of addition every time the result of addition is outputted from the first adder.

3. A computer readable storage medium comprising a phase difference detection program encoded and stored in a computer readable format, the program configured to cause a computer to function as a phase difference detector for detecting a phase difference between a first AC signal and a second AC signal having a same frequency as a fundamental frequency of the first AC signal, the program causing the computer to function as:

a sine wave generator that generates a sine wave signal having the same frequency as the fundamental frequency;

a cosine wave generator that generates a cosine wave signal having the same frequency as the fundamental frequency;

a first signal multiplier that multiplies the first AC signal and the sine wave signal;

a second signal multiplier that multiplies the first AC signal and the cosine wave signal;

a third signal multiplier that multiplies the second AC signal and the sine wave signal;

a fourth signal multiplier that multiplies the second AC signal and the cosine wave signal;

a DC component extraction unit that extracts four DC components by removing an AC component from a result of multiplication in each of the first through the fourth signal multipliers;

a trigonometric function computation unit that obtains a sine value and a cosine value of the phase difference by a computation using the four DC components; and a phase difference computation unit that uses the cosine value and the sine value computed by the trigonometric function computation unit to compute arctangent of a ratio of the sine value to the cosine value to obtain the phase difference, wherein:

when the first AC signal is $A_1 \cdot \cos(2\pi f_0 \cdot t + \phi_1) + h_1(t)$ (where $h_1(t)$ is the sum of harmonic components) and the second AC signal is $A_2 \cdot \cos(2\pi \cdot f_0 \cdot t + \phi_2) + h_2(t)$ (where $h_2(t)$ is sum of harmonic components), the sine wave signal generated by the sine wave generator and the cosine wave signal is generated by the cosine wave generator are expressed as $\sin(2\pi \cdot f_0 \cdot t)$ and $\cos(2\pi \cdot f_0 \cdot t)$, respectively, the four DC components extracted by the DC component extraction unit are expressed as $R_1 = (A_1/2) \cdot \cos(\phi_1)$, $I_1 = (-A_1/2) \cdot \sin(\phi_1)$, $R_2 = (A_2/2) \cdot \cos(\phi_2)$ and $I_2 = (-A_2/2) \cdot \sin(\phi_2)$, and the trigonometric function computation unit computes $R_1 \times R_2 + I_1 \times I_2$ to obtain a cosine value expressed as $(A_1 \cdot A_2/4) \cdot \cos(\phi_r)$ (where $\phi_r = \phi_2 - \phi_1$) and computes $R_2 \times I_1 - R_1 \times I_2$ to obtain a sine value expressed as $(A_1 \cdot A_2/4) \cdot \sin(\phi_r)$.

4. A plasma processing system for plasma-processing an object by supplying two high-frequency voltages having a same frequency and a phase difference to a pair of electrodes of a plasma chamber, the system comprising:

a phase difference detector for detecting a phase difference between a first AC signal and a second AC signal having a same frequency as a fundamental frequency of the first AC signal, the detector comprising:

a sine wave generator that generates a sine wave signal having the same frequency as the fundamental frequency;

a cosine wave generator that generates a cosine wave signal having the same frequency as the fundamental frequency;

a first multiplier that multiplies the first AC signal and the sine wave signal;

a second signal multiplier that multiplies the first AC signal and the cosine wave signal;

a third signal multiplier that multiplies the second AC signal and the sine wave signal;

a fourth signal multiplier that multiplies the second AC signal and the cosine wave signal;

a DC component extraction unit that extracts four DC components by removing an AC component from a result of multiplication in each of the first through the fourth signal multipliers;

a trigonometric function computation unit that obtains a sine value and a cosine value of the phase difference by a computation using the four DC components; and a phase difference computation unit that uses the cosine value and the sine value computed by the trigonometric function computation unit to compute arctangent of a ratio of the sine value to the cosine value to obtain the phase difference;

an AC voltage detector that detects AC voltages at respective input ends of the paired electrodes and outputs to the phase difference detector one of voltages detected as the first AC signal and the other one of the voltages detected as the second AC signal;

an input unit for inputting control values of the frequency and the phase difference;

a computation unit that computes difference between the control value of the phase difference inputted by the input unit and a phase difference detected by the phase difference detector;

a first high-frequency instruction signal generator that generates, based on the control value of the frequency, a first high-frequency instruction signal having the frequency and a zero phase angle;

a second high-frequency instruction signal generator that generates, based on the control value of the frequency and the difference between phase differences computed by the computation unit, a second high-frequency instruction signal having the frequency and a phase angle of the difference between the phase differences;

a first high-frequency generator for outputting, based on the first high-frequency instruction signal, a high-frequency voltage having the frequency of the control value and a zero phase angle to one of the paired electrodes; and a second high-frequency generator for outputting, based on the second high-frequency instruction signal, a high-frequency voltage having the frequency of the control value and a phase angle of the difference between phase differences to the other one of the paired electrodes.

5. The plasma processing system according to claim 4, wherein: the first high-frequency instruction signal generator is provided by a direct digital synthesizer comprising:

a second clock generator that generates a second reference clock, a second frequency retaining unit that retains a control value of a frequency inputted by the input unit, a second adder that adds the control value of the frequency retained in the second frequency retaining unit and a result of addition and outputs a result every time a clock pulse of the second reference clock is inputted, a second waveform storing unit that stores a table of wave height values of predetermined sine waves or cosine waves and outputs a wave height value corresponding to the result of addition every time the result of addition is outputted from the second adder, and a first signal converter that converts a wave height value outputted from the second waveform storing unit into an analog signal, the second high-frequency instruction signal generator is provided by a direct digital synthesizer comprising:

a third frequency retaining unit that retains a control value of a frequency inputted by the input unit, a phase difference retaining unit that retains difference between the phase differences computed by the computation unit;

a third adder that adds the control value of the frequency retained in the third frequency retaining unit and a result of addition and outputs a result every time a clock pulse of the second reference clock is inputted, a fourth adder that adds the difference between the phase differences retained in the phase difference retaining unit and a result of addition and outputs a result every time a clock pulse of the second reference clock is inputted, a third waveform storing unit that stores a table of wave height, values of predetermined sine waves or cosine waves and outputs a wave height value corresponding to the result of addition every time the result of addition is outputted from the fourth adder, and a second signal converter that converts a wave height value outputted from the third waveform storing unit into an analog signal.

6. The plasma processing system according to claim 5, wherein when the first AC signal is $A_1 \cdot \cos(2\pi \cdot f_0 \cdot t + \phi_1) + h_1(t)$ (where $h_1(t)$ is the sum of harmonic components) and the second AC signal is $A_2 \cdot \cos(2\pi \cdot f_0 \cdot t + \phi_2) + h_2(t)$ (where $h_2(t)$ is the harmonic components), the sine wave signal generated by the sine wave generator and the cosine wave signal generated by the cosine wave generator are expressed as $\sin(2\pi \cdot f_0 \cdot t)$ and $\cos(2\pi \cdot f_0 \cdot t)$, respectively, the four DC components extracted by the DC components extraction unit are expressed as $R_1=(A_1/2)\cdot\cos(\phi_1)$, $I_1=(-A_1/2)\cdot\sin(\phi_1)$, $R_2=(A_2/2)\cdot\cos(\phi_2)$ and $I_2=(-A_2/2)\cdot\sin(\phi_2)$, and the trigonometric function computation unit computes $R_1 \times R_2 + I_1 \times I_2$ to obtain a cosine value expressed as $(A_1 \cdot A_2/4)\cdot\cos(\phi_r)$ (where $\phi_r = \phi_2 - \phi_1$) and computes $R_2 \times I_1 - R_1 \times I_2$ to obtain a sine value expressed as $(A_1 \cdot A_2/4)\cdot\sin(\phi_r)$.

7. The plasma processing system according to claim 5, wherein the sine wave generator and the cosine wave generator are provided by a direct digital synthesizer comprising:

a first clock generator that generates a first reference clock;

a first frequency retaining unit that retains a value of a fundamental frequency of the first AC signal;

a first adder that adds the value of a fundamental frequency retained in the first frequency retaining unit and a result of addition and outputs a result every time a clock pulse of the first reference clock is inputted; and a first waveform storing unit that stores a table of wave height values of predetermined sine waves or cosine waves and outputs a wave height value corresponding to the result of addition every time the result of addition is outputted from the first adder.

8. The plasma processing system according to claim 4, wherein when the first AC signal is $A_1 \cdot \cos(2\pi \cdot f_0 \cdot t + \phi_1) + h_1(t)$ (where $h_1(t)$ is the sum of harmonic components) and the second AC signal is $A_2 \cdot \cos(2\pi \cdot f_0 \cdot t + \phi_2) + h_2(t)$ (where $h_2(t)$ is the harmonic components), the sine wave signal generated by the sine wave generator and the cosine wave signal generated by the cosine wave generator are expressed as $\sin(2\pi \cdot f_0 \cdot t)$ and $\cos(2\pi \cdot f_0 \cdot t)$, respectively, the four DC components extracted by the DC component extraction unit are expressed as $R_1=(A_1/2)\cdot\cos(\phi_1)$, $I_1=(-A_1/2)\cdot\sin(\phi_1)$, $R_2=(A_2/2)\cdot\cos(\phi_2)$ and $I_2=(-A_2/2)\cdot\sin(\phi_2)$, and the trigonometric function computation unit computes $R_1 \times R_2 + I_1 \times I_2$ to obtain a cosine value expressed as $(A_1 \cdot A_2/4)\cdot\cos(\phi_r)$ (where $\phi_r = \phi_2 - \phi_1$) and computes $R_2 \times I_1 - R_1 \times I_2$ to obtain a sine value expressed as $(A_1 \cdot A_2/4)\cdot\sin(\phi_r)$.

9. The plasma processing system according to claim 4, wherein the sine wave generator and the cosine wave generator are provided by a direct digital synthesizer comprising:

a first clock generator that generates a first reference clock;

a first frequency retaining unit that retains a value of a fundamental frequency of the first AC signal;

a first adder that adds the value of a fundamental frequency retained in the first frequency retaining unit and a result of addition and outputs a result every time a clock pulse of the first reference clock is inputted; and a first waveform storing unit that stores a table of wave height values of predetermined sine waves or cosine waves and outputs a wave height value corresponding to the result of addition every time the result of addition is outputted from the first adder.

10. A computer readable storage medium comprising a phase difference detection program encoded and stored in a computer readable format, the program configured to cause a computer to function as a phase difference detector for detecting a phase difference between a first AC signal and a second AC signal having a same frequency as a fundamental frequency of the first AC signal, the program causing the computer to function as:

a sine wave generator that generates a sine wave signal having the same frequency as the fundamental frequency;

a cosine wave generator that generates a cosine wave signal having the same frequency as the fundamental frequency;

a first signal multiplier that multiplies the first AC signal and the sine wave signal;

a second signal multiplier that multiplies the first AC signal and the cosine wave signal;

a third signal multiplier that multiplies the second AC signal and the sine wave signal;

a fourth signal multiplier that multiplies the second AC signal and the cosine wave signal;

a DC component extraction unit that extracts four DC components by removing an AC component from a result of multiplication in each of the first through the fourth signal multipliers;

a trigonometric function computation unit that obtains a sine value and a cosine value of the phase difference by a computation using the four DC components; and a phase difference computation unit that uses the cosine value and the sine value computed by the trigonometric function computation unit to compute arctangent of a ratio of the sine value to the cosine value to obtain the phase difference, wherein the sine wave generator and the cosine wave generator are provided by a direct digital synthesizer comprising:

a first clock generator that generates a first reference clock;

a first frequency retaining unit that retains a value of a fundamental frequency of the first AC signal;

a first adder that adds the value of a fundamental frequency retained in the first frequency retaining unit and a result of addition and outputs a result every time a clock pulse of the first reference clock is inputted; and a first waveform storing unit that stores a table of wave height values of predetermined sine waves or cosine waves and outputs a wave height value corresponding to the result of addition every time the result of addition is outputted from the first adder.

* * * * *